United States Patent

[11] 3,626,257

[72] Inventors Leo Esaki
Chappaqua;
Rudolf Ludeke, Katonah; Raphael Tsu, Yorktown Heights, all of N.Y.
[21] Appl. No. 811,871
[22] Filed Apr. 1, 1969
[45] Patented Dec. 7, 1971
[73] Assignee International Business Machines Corporation
Armonk, N.Y.

[54] SEMICONDUCTOR DEVICE WITH SUPERLATTICE REGION
22 Claims, 10 Drawing Figs.

[52] U.S. Cl. .......... 317/234 R, 317/235 K, 317/235 AL, 317/235 AK, 317/235 AD
[51] Int. Cl. .......... H01l 5/00
[50] Field of Search .......... 317/234 (10), 235 (25), 235 (42), 235 (43), 235; 331/107 G, 115; 307/284

[56] References Cited

UNITED STATES PATENTS

| | | | |
|---|---|---|---|
| 3,171,068 | 2/1965 | Denkewalter | 317/234 |
| 3,467,896 | 9/1969 | Kroemer | 317/234 |
| 3,356,866 | 12/1967 | Misawa | 307/88.5 |
| 3,479,611 | 11/1969 | Sandbank | 331/52 |
| 3,328,584 | 6/1967 | Weinstein | 250/206 |

OTHER REFERENCES

R. Anderson et al., I.B.M. Technical Disclosure Bulletin, Vol. 3, No. 4, Sept. 1960. Article entitled, " Multiple Junction Semiconductor."

*Primary Examiner*—John W. Huckert
*Assistant Examiner*—Martin H. Edlow
*Attorneys*—Hanifin and Jancin and John E. Dougherty, Jr.

ABSTRACT: The semiconductor device has two highly N-type end portions to which ohmic contacts are made, and a central portion which has a one dimensional spatial periodic variation, in its band-edge energy. This spatial periodic variation, or superlattice, is produced by doping or alloying to form a plurality of successive layers having alternating band-edge energies. The period of the spatial variation is less than the carrier mean free path, and is such as to form in momentum space a plurality of periodic mini-zones which are much smaller than the Brillouin zones. The device exhibits a bulk negative resistance and is used in oscillator and bistable circuits.

INVENTORS
LEO ESAKI
RUDOLF LUDEKE
RAPHAEL TSU

BY [signature]

ATTORNEY

SEMICONDUCTOR DEVICE WITH SUPERLATTICE REGION

BACKGROUND OF THE INVENTION

1. Field of the Invention

This invention relates to semiconductor devices and particularly to that class of semiconductor devices in which a negative resistance is produced in the bulk of the semiconductor. The device is used in various types of bistable and oscillator circuits. It does not require for its operation a junction, carrier injection, or an intervalley transfer, but rather includes a one dimensional periodic spatial variation in its band-edge energy, here termed a superlattice, which produces a plurality of mini-zones in momentum space, to provide the desired bulk negative resistance. The periodicity of the band-edge energy is a result of a periodicity in the electron potential within the material. Though certain of the above named prior art techniques are not essential to the operation of the disclosed device, they can be combined with the basic structure in various applications.

2. Prior Art

Pertinent prior art in terms of the basic theoretical considerations involved in the present invention is found in the book by Jean Brillouin, entitled "Wave Propagation in Periodic Structures", published by McGraw-Hill Book Company, Inc., in 1953. From an application standpoint, U.S. Pat. No. 2,957,377 issued on Mar. 14, 1961, to P. J. Price and J. W. Horton, is pertinent in the teaching relative to a device with bulk negative resistance produced by interaction of carriers with the periodic potential associated with the crystalline lattice itself. Other art which is principally of interest in that it deals with bulk negative resistance, though produced by different phenomena, is as follows:

a. U.S. Pat. No. 3,365,583 issued on Jan. 23, 1968, to J. B. Gunn;

b. Copending and commonly assigned application Ser. No. 660,461, filed on Aug. 16, 1967, in behalf of J. C. McGroddy and M. I. Nathan c. An article by Ridley and Pratt entitled "A Bulk Differential Negative Resistance Due to Electron Tunnelling Through an Impurity Potential Barrier," which appeared in Physics Letters, Vol. 4, 1963, pp. 300–302; and d. British Pat. No. 849,476 to J. B. Gunn, published on Sept. 28, 1960.

SUMMARY OF THE INVENTION

Though there have been a large number of highly successful negative resistance devices developed in recent years, and some of the most recently developed devices employ bulk effects and exhibit very fast switching speeds, effort has continued to develop different and higher frequency negative resistance switching devices. In junction type devices, including transistors and tunnel diodes, the inherent junction capacitance presents a barrier to attaining higher speeds. In bulk type devices, using the Gunn Effect, though high frequency operation has been achieved approaching the presently predicted theoretical limit of $10^{12}$ cycles/sec., the devices themselves do not easily lend themselves to applications requiring a DC negative resistance. Proposed bulk negative resistance devices using interaction with the periodic potential of the natural crystal lattice are not practical because of the limitations imposed by the scattering times of the carriers.

In accordance with the principles of the present invention, a new class of devices is provided which offers the possibility of achieving extremely high frequency performance. Further, these devices exhibit a DC negative resistance and can be used in oscillator circuits, switching circuits, and amplifier circuits.

Since the phenomenon employed in these devices involves the interaction of the carriers with the periodic potential of a superlattice, the devices are not limited in speed by scattering time, by minority carrier lifetime, nor impact ionization, do not include inherent high capacitance, and essentially employ quantum mechanical effects. In novel negative resistance devices of the present invention, the theoretical ultimate limit in frequency may be reached when the energy quantum of the frequency becomes a significant fraction of the width of the narrow energy band of the semiconductor.

These advantages are realized by forming in the semiconductor body what is here termed a superlattice. More specifically, a portion of the device is prepared to exhibit a periodic potential different from that of a uniform crystal lattice, with which the carriers in the material can interact to produce the desired resistance and conductivity characteristics. The superlattice includes what is here termed a one dimensional spatial variation in the band-edge energy. More precisely, there is a one dimensional spatial variation of the effective potential which prevails in the formulation of the dynamics of carriers in the system. The superlattice structure is achieved by forming a plurality of successive layers of semiconductor material with different energy band characteristics. A first and alternate layers exhibit a different band-edge energy from the second and alternate layers. This is accomplished either by alloying or doping and the result is a one dimensional periodic spatial variation in the band-edge energy. Since the carriers need to interact with this varying energy structure, the period of the spatial variation is less than the mean free path of the carriers in the semiconductor. There are provided a sufficient number of these spatial periods to obtain the necessary interaction for the desired resistance and conductivity characteristics. The period of the spatial variations is, however, sufficiently large that there is formed by this superlattice, in wave vector space ($k$), a number of mini-zones which are much smaller than the Brillouin zones associate with the crystal lattice itself. As a result, bulk negative resistance is obtained in response to an applied voltage less than would be required to produce interband tunnelling between the mini-zones, and the momentum gain by the carriers within the time interval between collisions is sufficient for the production of the negative resistance.

Thus, it is an object of the present invention to produce a new class of semiconductor devices which include an artificially produced superlattice.

Another object is to provide improved high-speed negative resistance devices and circuits using these devices.

Still another object is to provide semiconductor devices which exhibit in momentum space a plurality of periodic mini-zones which are smaller than the crystalline Brillouin zones in a semiconductor.

These and other objects, features and advantages of the invention will be apparent from the following more particular description of preferred embodiments of the invention, as illustrated in the accompanying drawings.

DESCRIPTION OF PREFERRED EMBODIMENTS

Figure 1:
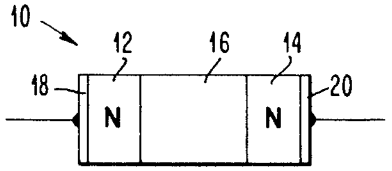
FIG. 1 is a schematic showing of a semiconductor device including a negative resistance superlattice according to the principles of the present invention.

FIG. 1 is an illustration of a bulk semiconductor device including a superlattice. In this figure the entire semiconductor device is designated 10 and is shown to include two end portions 12, and 14 which are N type separated by a central portion 16 which includes the superlattice structure. Two ohmic contacts 18 and 20 are made to the end portions and the connections for operating the device are connected to these ohmic contacts. The portion 16, which includes the superlattice, differs from conventional semiconductors in that within this portion of the body there is a one dimensional spatial variation in the band-edge energy. More specifically, this variation is in the direction along the length of the body between the contacts 18 and 20, and the band-edge energy in the superlattice portion 16 does not vary in the other two directions.

Figure 1A:
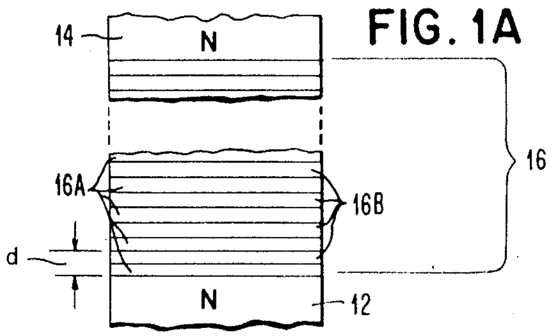
FIG. 1A is an enlarged representation of the layered structure of the superlattice portion of the device in FIG. 1.
Figure 2:
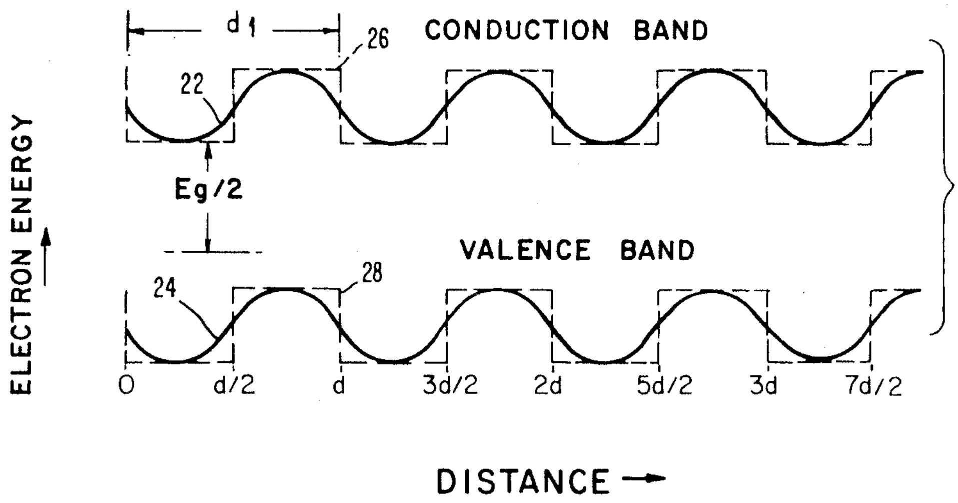
FIG. 2 is a representation of the energy diagram of the superlattice portion of the device of FIG. 1 when the adjacent layers are formed by doping.
Figure 3:
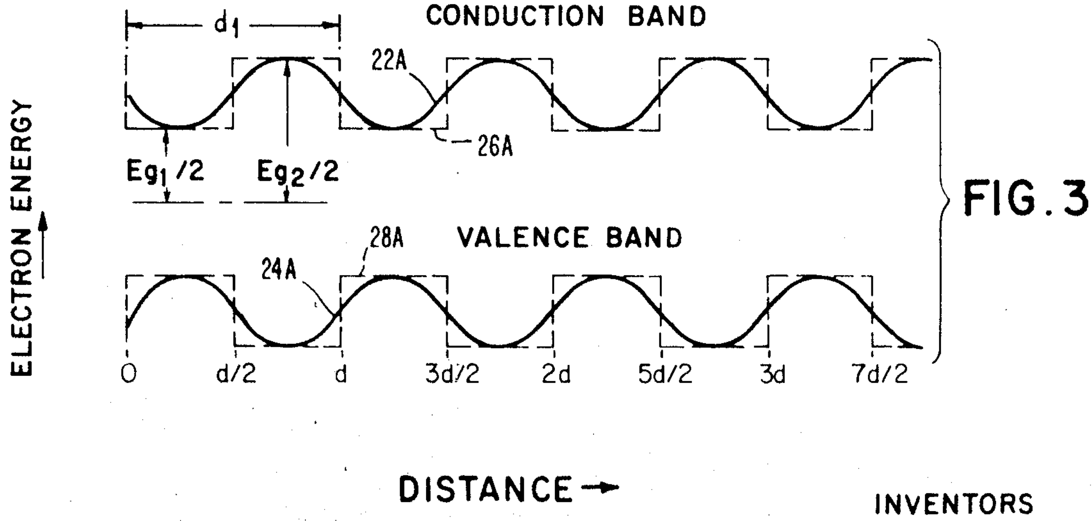
FIG. 3 is a representation of the energy diagram of the superlattice portion of the device of FIG. 1 when the adjacent layers are formed by alloying.

The physical structural arrangement within portion 16 is shown in more detail in FIG. 1A, and the energy band structure for two different embodiments in FIGS. 2 and 3. As shown in FIG. 1A, the portion 16 of the device is made up of a number of successive regions or layers. A first and alternate ones of these layers are designated **16*a* and the second and alternate layers, 16*b*. The layers 16*a* and 16*b* are not discrete separate parts of the body but together with end portions 12 and 14, are part of a single crystalline body. However, there are differences in the band-edge energy characteristics of the successive layers 16*a* and 16*b*** and the structure is formed by laying down successive layers in an epitaxial process. Therefore, it is considered proper to describe the structure in terms of these successive layers.

The layered superlattice structure of FIG. 1A is formed either by doping or by alloy techniques. When doping is employed, and considering germanium as a typical example of a material to be used, the lowermost portion of the semiconductor body as viewed in FIG. 1A is the N region 12, which is either a part of the original substrate of germanium on which the body is epitaxially grown, or itself is epitaxially grown on a substrate which is removed after the body was epitaxially formed. In any event, N portion 12 is doped with an impurity such as phosphorous, antimony, or arsenic all of which are N type impurities in germanium. Each of the layers **16*a* is epitaxially grown to be N type ($10^{14}$—$10^{17}$ atoms per cm$^3$) and each of the layers 16*b* is grown to be intrinsic. In such a case, the portion 16 is formed of a number of regions or layers alternating between N type germanium and intrinsic germanium. Each of the layers 16*a* and 16*b* in the particular embodiments shown has the same width and each pair of layers forms one complete spatial period of the alternating layered structure. This spatial period is designated $d$ in FIG. 1A. The value of the spatial period, hereinafter given in angstrom units, has an important bearing on the characteristics of the superlattice as will be evident from the description given below of FIGS. 4, 5 and 6. It suffices for the present to point out that the spatial period $d$ is preferably between 50 and 500 angstroms; and, therefore, the thickness of the layers 16*a* and 16*b*** is between 25 and 250 angstroms.

The layers **16*a* and 16*b*, when formed by doping, need not alternate between N type and intrinsic, but may be alternately N+ and N. The alternate layers may also be formed using N and P type impurities. The important consideration is the periodic energy band structure which is shown in FIG. 2. In this figure, there are shown the energy profiles for the edge of the valence band and for the lowest energy conduction band. Sinusoidal representations, shown in full line and designated 22 and 24, represent one type of profile and the dotted representations 26 and 28 in square wave form illustrate another type of band edge variation. The abscissa of the plot of FIG. 2 is the distance along the length of the superlattice portion, and is plotted in terms of the value of the spatial period $d$. As shown in FIG. 2, $d$ is the thickness of a pair of the alternating layers 16*a* and 16*b*. For each spatial period $d$ there is a complete cycle of the variation in the energy band structure. The first spatial period formed by the lowermost two layers 16*a* and 16*b*, as viewed in FIG. 1A, is represented by $d_1$ in FIG. 2 directly related to the idealized square wave type of representations of curves 26 and 28. These curves assume that each layer 16*a* and each layer 16*b* is homogeneous throughout its thickness and there is an abrupt change in going from one to the other. However, though the temperature at which the body is grown is kept as low as possible to avoid diffusion between the layers, the curved representations 22 and 24** are considered to be more easily realized.

The band-edge energy as represented in FIG. 2 is characteristic of the semiconductor superlattice material. As can be seen from the figure, the band-edge energy for the conduction band varies periodically with distance through the superlattice structure. The periodic variation is one dimensional along the length of the structure since there is no variation along the other directions within the layers. Further, it should be noted that the energy gap Eg in FIG. 2 is essentially the same throughout the superlattice, and the periodic variation is in the electron potential.

As has been stated above, the superlattice structure formed by the alternating layers **16*a* and 16*b* may also be formed by alloying. If, as before, germanium is used as the substrate and the end portions 12 and 14 as viewed in FIGS. 1 and 1A are doped heavily to be N type, then the alternating regions 16*a* and 16*b* are typically germanium and an alloy of germanium and silicon. Specifically, the first and alternating layers 16*a* are formed of N type germanium and the second and alternating layers 16*b* are formed by an alloy of germanium and silicon which can be represented as $Ge_{1-x}Si_x$. The germanium silicon alloy has a larger energy gap than the germanium itself, and the desired periodicity in the energy band structure is obtained as shown by curves 22A, 24A, 26A and 28A** in FIG. 3.

Where germanium and germanium silicon alloy layers are used, a typical value for $x$ in the alloy is between 0.1 and 0.2. Other examples of alloys that may be used are alloys of III–V and II–VI compounds. For example, the body may be primarily a gallium arsenide body with the N+ regions 12 and 14 highly doped to be N+ type gallium arsenide, the layer **16*a*, N type gallium arsenide although not heavily doped N type, and the layer 16*b*** the alloy $Ga_{1-x}Al_xAs$ where $x$ would typically be between 0.1 and 0.4. The gallium aluminum arsenide alloy has a higher band gap than gallium arsenide itself and thus the desired periodic structure is achieved. The greater the value of $x$ in such a structure, the greater is the fluctuation in the energy band edge. Another typical system is InAs and $In_{1-x}Ga_xAs$ in which case $x$ can vary over very large values up to the point where the intermediate layer is completely gallium arsenide and $x$=1.0.

Relating the structure of FIG. 1A to the energy diagram of FIG. 3, the first two layers 16and **16*b* immediately above the N+ portion 12 form one spatial period of the superlattice structure which extends on the energy diagram of FIG. 3 in the region represented as $d_1$. In FIG. 3, $Eg_1$ represents the band gap of the elemental layers 16*a* and $Eg_2$ represents the larger band gap of the alloy layers 16*b*. It should also be noted that the alloying may be carried out in such a way during the epitaxial growth that each of the layers 16*a* is an alloy as well as the layer 16*b*. In such a case, in the layer 16*a*, the value $x$ is smaller than it is for the alloy in layer 16*b***.

The device shown in FIG. 1 includes the two N type portions 12 and 14. These portions are not necessary to the operation of the device, but depending on the application, are added to facilitate the making of ohmic contacts. Actually, these regions may be merely the extensions of the ohmic contact into the body. In microwave and other high frequency applications, it is preferable to make a direct electrode contact to the superlattice structure. This electrode or electrodes is chosen to be transparent to the particular electromagnetic frequency so that energy can be transmitted through it to and from the superlattice. Thus, the entire body may be formed of a superlattice structure with contacts made to this structure, or other regions may be added according to the particular application in which the device is to be used.

The discussion to this point has been directed primarily to the spatial structure of the superlattice, i.e. the structure of the layers and the potential energy changes achieved along the actual length of the superlattice. Further, though an unspecified number of layers is shown in FIG. 1A, the energy band characteristics of FIGS. 2 and 3 shown only a few of these layers, the reason being that the energy structure is repetitive. Each pair of layers added to the structure of FIG. 1A produces one more spatial period of the type shown in FIGS. 2 and 3. However, the number of layers and, therefore, the number of spatial periods is an important consideration in the design of actual devices. Generally speaking, there should be a minimum of 10 and preferably at least 20 such layers. Twenty layers, which is 10 spatial periods, provide sufficient interaction between the carriers and the superlattice structure to achieve the desired conductivity characteristics for the devices shown to embody the invention in this application.

It should also be pointed out here that though it has been broadly stated that the device shown in FIGS. 1 and 1A are prepared by epitaxial methods, great care must be exercised in the preparation of the layers **16*a* and 16*b*** and this presents some difficulty where the individual layers are as thin as 25 angstroms. Thus, though the normal techniques of epitaxial growth from a vapor or solid solution may be applicable, it is preferable to form these epitaxial layers in a high vacuum system. In such a case, the various constituents needed to form the layers are placed in separate boats and a shuttering system is employed to epitaxially grow the layers with the desired characteristics on the substrate.

Figure 4:
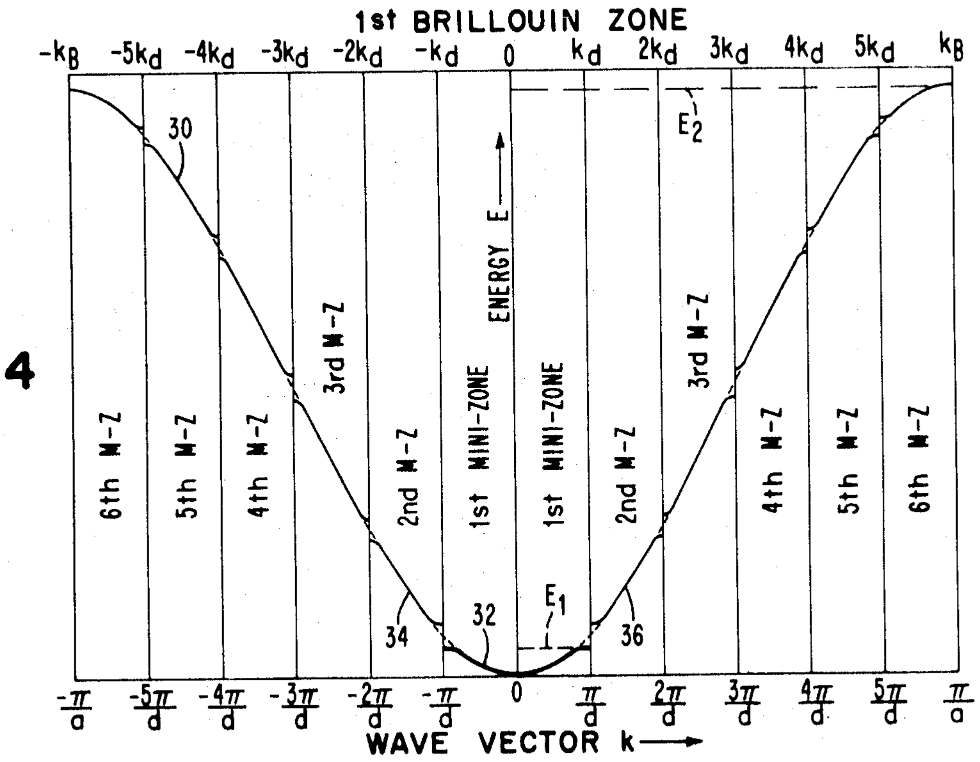
FIG. 4 is a plot of energy (E) versus crystal momentum or wave vector ($k$) illustrating the energy band structure and the Brillouin zone associated with the crystal lattice itself as compared to the energy band structure and mini-zones of a superlattice structure.
Figure 5:
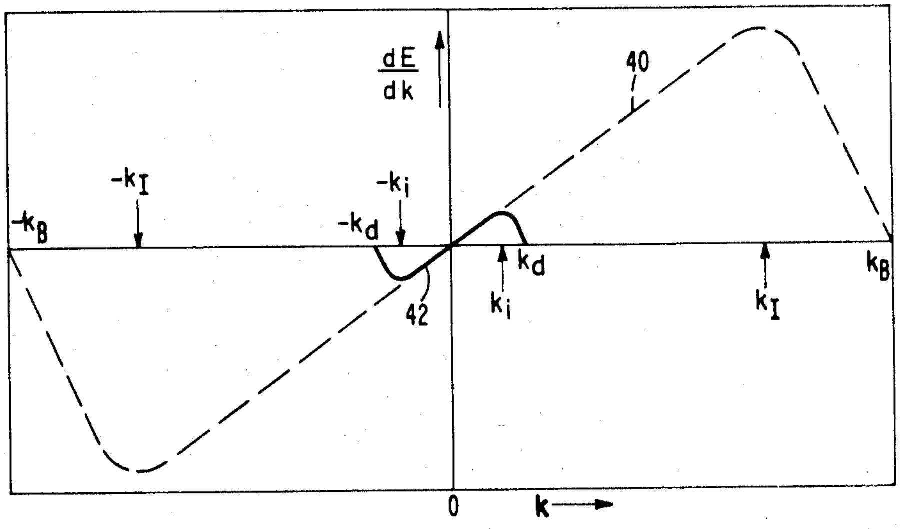
FIG. 5 is a plot of the first derivative of the energy with respect to wave vector ($k$) showing both the curve for the normal crystal structures and for the superlattice structure.
Figure 6:
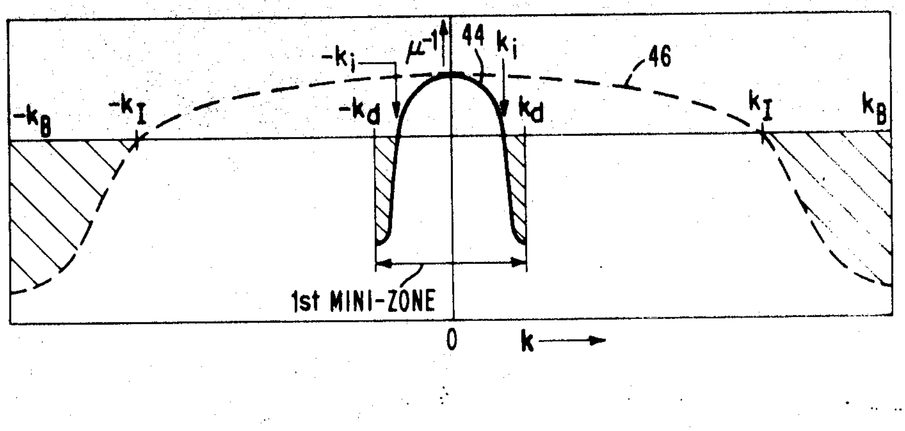
FIG. 6 is a plot of second derivative of the energy (E) of FIG. 4, which is proportional to inverse effective mass ($\mu^{-1}$), versus wave vector ($k$) and this plot also depicts a comparison of this characteristic for the normal crystal lattice with the characteristic for a superlattice structure.

As has been discussed above, the superlattice is formed by a periodic variation of band-edge energy along the length of the superlattice portion of the device. Further, one spatial period of this variation has been termed ($d$) and is preferably between 50 and 500 angstroms. However, to understand the energy-wave vector relationships which are basic to the production of the negative resistance characteristics of the device built in accordance with the principles of the invention, reference must be made to the drawings in FIGS. 4, 5 and 6. In these figures, there are plotted certain characteristics of the superlattice relative to crystal momentum which is also called the wave vector ($k$) in the material. The value of $k$ is inversely proportional to actual electron wavelength in space. In FIGS. 4, 5 and 6, the value $k$ is plotted from a centrally located zero value in terms of  $/d$, wherein $d$ is the spatial period discussed above. At the extremities of the ordinate axis, the value $\pi/a$ is plotted where the value "$a$" represents the normal lattice spacing in the semiconductor material. Typically, in materials of the type which have been discussed, germanium, gallium arsenide, etc., the normal lattice spacing is about 5 angstroms. In the plots of FIGS$\pi$4, 5 and 6, the value $d$ is equal to 30 angstroms and, therefore, $\pi/d$ is one-sixth of $\pi/a$. In the drawing of FIGS. 4, 5 and 6, the choice of the value $d$ to be 30 angstroms is dictated by an attempt to shown graphically the proper relationships in momentum space between the superlattice structure and the actual lattice structure. In actual point of fact, as has been stated above, the minimum spatial period $d$ preferred for the practice of the present invention is about 50 angstroms.

In FIG. 4 there is plotted the energy E of the band structure for both a normal crystalline structure without a superlattice and for a crystalline structure prepared as described above to include a superlattice. Considering the case of the actual lattice first, the single continuous curve 30 which is dotted in places and extends from the upper left-hand portion of the drawing down through zero and back up to the upper right-hand portion represents the normal energy structure. This is the typical curve for what has been called in the past a Brillouin zone and the zone extends from $-\pi/a$ to $+\pi/a$.

When a superlattice is added to the structure as described above, with the value $d$ being six times the value $a$, actually a plurality of what are here termed mini-zones are produced in the material. The curve in the central one of these mini-zones is designated 32 and is shown in heavier line than the remaining portions of the drawing. This curve represents the energy band structure for the lowest energy band in the superlattice. There is a termination of the energy curve at each value of $\pi/d$ for the mini-zone structure and a new band at a somewhat higher energy exists in the next zone. The dotted line representation crossing the boundaries of each of these zones indicates the shape of the continuous curve which exists in a normal crystalline lattice without a superlattice structure. However, the same low energy curve 32 can be considered to repeat itself cyclically through the zones, and, therefore, there is a periodicity in momentum space as represented by the lower band edge of curve 32. Further, there is a separation in energy at $\pi/d$ and at the other mini-zone boundaries between the upper portion of the low energy band in that zone and the next higher energy band beginning in the next mini-zone. The width of this energy gap at the end of the first mini-zone, as shown in FIG. 4, i.e. between the full line curve 32 and the curves 34 and 36 in the second mini-zone, is a consideration in the practice of the present invention. The width of this gap is determined by the amplitude of the variation in the band edges as shown in FIGS. 2 and 3. As the amplitude of the periodic variation is increased, the energy gap between the upper energy state of curve 32 and the energy bands represented by curves 34 and 36 is increased. This results in a decrease in tunnelling probability from the lower band 32 to the higher bands 34 and 36. This type of tunnelling is avoided in the devices herein disclosed as embodying the present invention.

From the curve of FIG. 4, it is apparent that the superlattice structure provides, in momentum space, instead of one Brillouin zone, a plurality of much smaller mini-zones. It is further apparent that as the value $d$ is made larger, more mini-zones within one Brillouin zone are provided. Since $d$ increases as the thickness of the layers **16*a* and 16*b* (FIG. 1A**), is increased, it might seem that $d$ should be very large. However, $d$ cannot be so large as to be greater than the mean free path of carriers in the structure, and this places a limitation on the number of mini-zones which can be accommodated and still achieve the desired conductivity characteristics in the superlattice structure.

The basis for the negative conductivity becomes more apparent upon examining FIGS. 5 and 6. In FIG. 5, the first derivative of energy (E) with respect to wave $k$ is plotted. In this figure, the dotted representation 40 is for a normal lattice structure and the full line curve 42 is for the superlattice structure and is limited to the showing of the first mini-zone represented by curve 32 in FIG. 4. The second derivatives of the curves of FIG. 4 are plotted in FIG. 6 against wave vector $k$. The second derivative is proportional to the inverse of the effective mass ($\mu^{-1}$) of the carriers and in FIG. 6 the full line representation of curve 44 represents the characteristic for the mini-zone whereas the dotted curve 46, again shown for comparison purposes, is the characteristic for the Brillouin zone in a normal crystal lattice.

From an examination of the curves of FIGS. 4, 5 and 6, a number of differences between the actual crystal characteristics and the superlattice characteristics become apparent. First, the period in $k$ space ($2\pi/d$) for the superlattice is much less than the period in $k$ space for the actual lattice $2\pi/a$. Further, the maximum characteristics for the superlattice in energy E (FIG. 4) and the first derivative (FIG. 5) occur at much smaller values of wave vectors. Also, as is shown in FIG. 6, the mass of the carriers (electrons in preferred N type material) in the superlattice increase much more quickly in $k$ space than would be the case in a normal lattice structure, and the mass actually becomes negative within the mini-zones. Since the electrons are primarily in the lowest energy band in the superlattice represented by curve 32 in FIG. 4, and insofar as the interaction of electrons is concerned, this curve can be considered repetitive, the energy ($E_1$), of the highest energy state in the band of the superlattice curve 32 is much lower than the maximum energy ($E_2$) of the highest energy state of a band of the normal lattice curve 30. One of the severe limitations on practically realizing the characteristics exemplified by the curves in FIGS. 4, 5 and 6 for a normal crystal lattice structure is that the scattering time within the semiconductor material is sufficiently limited that the electrons actually scatter before the states can be achieved which would produce the desired conductivity characteristics. This limitation is overcome with the novel superlattice structure, where even though the scattering time may be shorter, the establishment of the mini-zones makes it possible to achieve the desired characteristics within the scattering time of the carriers.

Thus, when an electric field is applied to the device of FIG. 1, with the superlattice structure shown, the effective mass, as shown by curve 44 in FIG. 6, initially increases. At $k_i$ in $k$ space, the effective mass of the electrons changes from positive mass to negative mass. This change is the basis for the DC negative resistance exhibited by the device, and is indicated in FIG. 6 to occur at an inflection point in $k$ space designated $k_i$.

Figure 7:
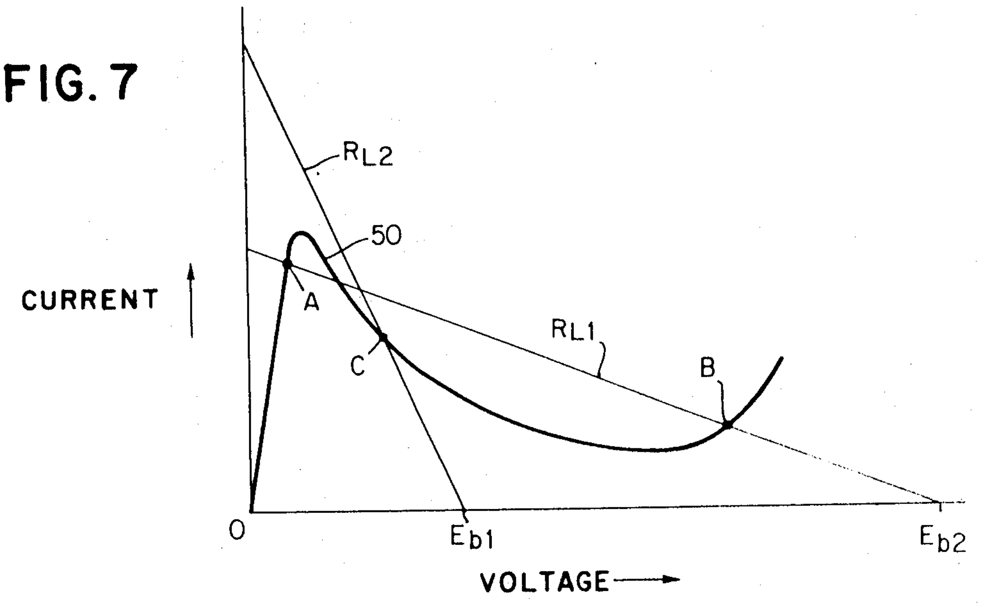
FIG. 7 is a voltage-current characteristic, with different load lines, illustrating the manner in which the device of FIG. 1 is operated in bistable or astable circuits.

FIG. 7 is a current-voltage characteristic for the device of FIG. 1, including the portion 16 having the superlattice characteristic discussed above. The device preferably includes about 100 spatial periods, as shown in FIG. 1A, of a width of about 100 angstroms so that there are 20 mini-zones within the Brillouin zone. ($d$=100 angstroms; $a$=5 angstroms.) It is again noted that the drawing of FIGS. 4, 5 and 6 with the lesser number of mini-zones (six) is for illustrative purposes only and generally the spatial period $d$ is chosen to provide at least 20 mini-zones ($d$=100 angstroms). The negative resistance curve for the device is designated 50 in FIG. 7 and it is shown in this figure with two load lines, $R_{L1}$ and $R_{L2}$. When the device is connected in a circuit with a load line $R_{L1}$, bistability is achieved at points A and B and the device can be switched between these points in a conventional way using circuitry of the type ordinarily used with tunnel diodes. When the device is coupled with a load line $R_{L2}$, the intercept is at point C, which is astable and oscillations are produced. It should be pointed out that curve 50 of FIG. 7 includes two positive resistance portions separated by the negative resistance portion. The first positive resistance portion and the negative resistance portion are produced by the superlattice structure as described above. The second positive resistance portion of the curve produced at higher voltages results from scattering and hot electron effects which become more dominant at higher values of electric field.

Figure 8:
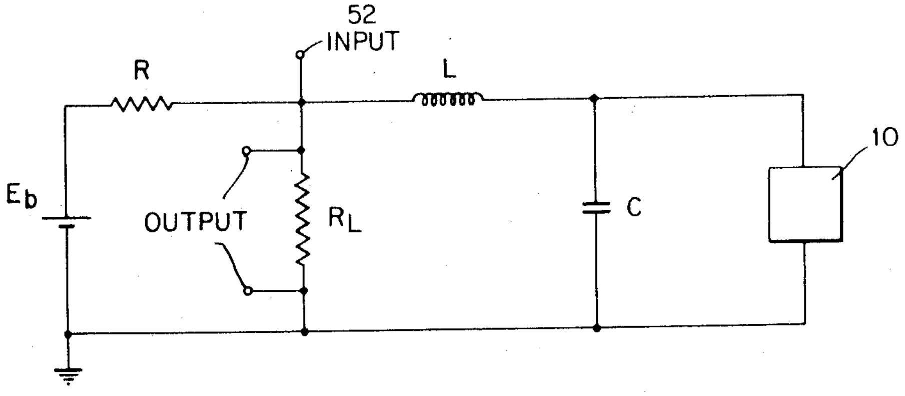
FIG. 8 is a circuit diagram including the negative resistance device of FIG. 1, and represents a circuit for operation in either the bistable or astable mode.

FIG. 8 shows a generalized circuit for achieving either oscillations or bistability. The circuit includes the novel negative resistance device, represented at 10, an inductance L, and capacitance C, which represent the distributed inductance and capacitance, a battery $E_b$, resistance R and a load resistance $R_L$. Resistor R has a higher resistance than the resistor $R_L$ and this latter resistor is chosen or adjusted to give either the bistable load line $R_{L1}$ or the astable load line $R_{L2}$ of FIG. 7. When resistor $R_l$ is chosen to provide oscillations, the battery $E_{b1}$ supplies sufficient voltage to exceed the threshold for negative resistance and the output oscillations are taken across the load resistor $R_L$. At the range of frequencies in which the load resistor $R_L$. At the range of frequencies in which the device is operable, the output is preferably coupled to a transmission line, and the entire circuit may be formed in a cavity. When the circuit is operated in the bistable mode using load line $R_{L1}$ of FIG. 7, the battery voltage is a bias voltage $E_{b2}$, and input signals of positive and negative polarity are applied at terminal 52 to switch the device 10 between its stable states. The output indication of the state of device 10 is taken across the load resistor.

Figure 9:
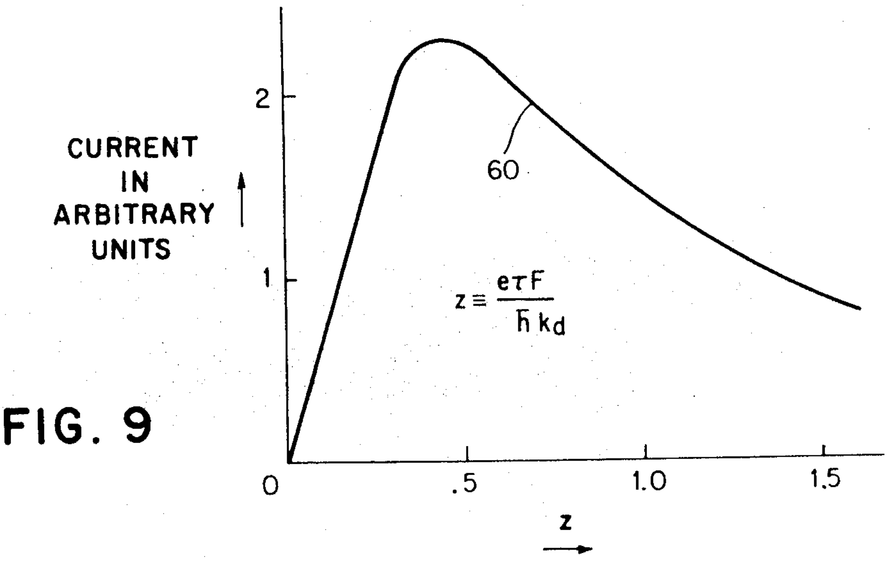
FIG. 9 is a plot of current through a superlattice structure versus a dimensionless term $z$ which incorporates the physical parameters which are determinative of the negative resistance.

A quantitative representation of the low field current behavior in the device 10 is shown by a curve 60 in FIG. 9. In this figure current through the device is plotted versus a dimensionless quantity $z$ which is equal to ( $\frac{e\tau F}{\hbar k_d}$ ) where:

$e$ = electron charge $\tau$ = scattering time

F = the electric field applied across the superlattice portion of the device $\hbar$ = Plank's constant/$_2\pi$ $k_d$ = the intercept in momentum space for the first mini-zone As is shown by the figure, when $z=1/\pi$, that is when the term $\frac{e\tau F}{\hbar k_d}=\frac{1}{\pi}$, the current begins to decrease resulting in a differential negative resistance.

Typical values for the parameters in the embodiment under consideration where $d$ = 100 angstroms are:

$\tau$=(6.7) ($10^{-13}$) sec.

$k_d$=($\pi$) ($10^6$) cm.$^{-1}$ $k_i$=0.75 $k_d$

F = $10^3$ volts/cm.

$e$ = (1.6) ($10^{-19}$) coulombs $\hbar$ = Plank's constant/$_2\pi$

The operation of the superlattice device can be enhanced, of course, by operation at lower temperatures where the scattering time is greater. In all modes of operation, this parameter is a limiting consideration in the design, as is the width of the tunnelling gap shown between the curves 32 and 36 in FIG. 4. The mean free path of an electron in the preferred N type device under consideration ($d$ = 100 angstroms) is more than 300 angstroms. In this case, a typical electron would be able, in its lifetime, to interact with at least three of the spatial periods (six of the layers 16a and 16b in FIG. 1A) which is sufficient for the interaction with the varying potential to produce the negative conductivity characteristics. As to the tunnelling probability from the lowest energy band in the superlattice to the next higher band, this is controlled by the amplitude of the variations in the band-edge energy as shown in FIGS. 2 and 3. It further depends upon the number of mini-zones present within a Brillouin zone. As the number of mini-zones is increased, and $d$ is increased, the energy gap between the energy bands in adjacent zones decreases.

It is because of the above considerations that the spatial period $d$ is preferably kept between 50 angstroms and 500 angstroms, the higher values demanding, however, a larger carrier lifetime than is usually available at room temperature. The lower value of 50 angstroms for the spatial period $d$ is dictated here by present day fabrication techniques, as well as the scattering time limitation. With improvements in fabrication technology and semiconductor material refinement, lower values of $d$ may be employed. The minimum number of spatial periods mentioned above are for the particular applications considered here, that is a minimum of five periods and probably at least 10 spatial periods. More than 10 periods are preferred for the particular devices disclosed but the basic superlattice structure may be employed in applications using as few as five spatial periods.

Further, the device is not limited in its application to the simple oscillator and bistable current shown. It may be used in a number of different types of negative resistance circuits, particularly in the high frequency range in which it is capable of operating. Thus, for example, the device may be used in amplifier circuits and connected within or combined with various types of transmission line and cavity structures.

Further, in FIGS. 2 and 3 the spatial periods $d$ are shown to include two symmetrical portions of equal width. This is not necessary to the practice of the invention since all that is required is that there be a spatial periodicity in the band-edge energy. This may be generally expressed by the following relationship:

$V(x)=V(x+nd)$ where $V$ = potential energy for carriers $x$ = distance $n$ = an integer $d$ = spatial period This type of an arrangement may be fabricated, for example, by controlling the growth so that the layers **16*a* and 16*b*** in FIG. 1A have different thicknesses.

Semiconductors such as Ge and Si which can be used in superlattice structures of the present invention have complex band structures. These are indirect gap materials and these materials also include two types of holes having different mass. Application of pressure may be used with such materials in order to produce the desired band-edge characteristics to which the superlattice can be imposed.

Though the preferred embodiments use N type material and the interaction of electrons with the periodic potential of the conduction band, the invention may also be practiced with P type material in which holes interact with the periodic potential of the valence band.

While the invention has been particularly shown and described with reference to preferred embodiments thereof, it will be understood by those skilled in the art that the foregoing and other changes in form and details may be made therein without departing from the spirit and scope of the invention.

What is claimed is:

1. A semiconductor device comprising:

a body of semiconductor material at least a portion of which is a superlattice structure having at least 10 layers of semiconductor material;

the first and alternate layers thereof having a given band-edge energy,

The second and alternate layers thereof having a band-edge energy different from said given band-edge energy and forming with said first and alternate layers at least five spatial periods, the width of each period being less than the mean free path of a carrier along the direction of the superlattice, and having an upper found of the order of 500 A.°, and voltage means connected across the ends of said device to produce an I–V characteristic which exhibits a negative resistance.

2. The device of claim 1 wherein the width of each of said spatial periods is between 50 angstroms and 500 angstroms.

3. The semiconductor device of claim 1 wherein adjacent ones of said layers of semiconductor material are differently doped.

4. The semiconductor device of claim 1 wherein adjacent layers of said semiconductor material have different energy gaps.

5. The semiconductor device of claim 1 wherein said portion includes at least 20 of said layers of semiconductor material.

6. The semiconductor device of claim 1 wherein said superlattice structure includes a plurality of layers of equal thickness of the same semiconductor material, all of said layers being at least slightly N type, a first and alternate ones of said layers being less heavily N type than the second and alternate ones of said layers.

7. The semiconductor device of claim 1 wherein said superlattice portion includes a plurality of layers of equal thickness, and a first and alternate ones of said layers exhibit a smaller band gap than the second and alternate ones of said layers.

8. The device of claim 1 wherein each of said layers has essentially the same thickness.

9. The device of claim 8 wherein each of said layers is between 25 and 250 angstroms thick.

10. The device of claim 1 wherein said first and alternate layers having said first band-edge energy characteristic are formed of a first semiconductor material having a first band gap, and said second and alternate layers having said second band-edge energy characteristic are formed of an alloy including said first semiconductor material which alloy has a second band gap larger than said first band gap.

11. The device of claim 1 wherein said portion comprises a single semiconductor material and said layers are differently doped to provide said first and second different band-edge energy characteristics.

12. The device of claim 11 wherein said first and alternate layers are N type and said second and alternate layers are N+ type.

13. The device of claim 11 wherein said first and alternate layers are intrinsic and said second and alternate layers are N type.

14. The device of claim 1 wherein said means for applying a potential further includes first and second ohmic contacts to said body including said portion, and means connected to said contacts for applying an electric field to said portion, said portion of said body responsive to said field to exhibit a negative resistance.

15. The device of claim 14 further including a load connected to said body which provides a resistance such that said body is DC stable in first and second different states.

16. A semiconductor device which exhibits bulk negative resistance comprising:

a superlattice structure formed from at least 10 layers of semiconductor material, the first and alternate layers thereof having a given band-edge energy, the second and alternate layers thereof having a band-edge energy different from said given band-edge energy and forming with said first and alternate layers at least five spatial periods, the width of each period being less than the mean free path of a carrier along the direction of the superlattice, and having an upper found of the order of 500 A., and means for applying a potential to said structure said potential being less than that needed for interband tunneling.

17. The device of claim 16 wherein each of said spatial periods is between 50 and 500 angstroms.

18. The device of claim 17 wherein said portion includes about 10 of said spatial periods and each period is about 100 angstroms.

19. A semiconductor device according to claim 16 further including means connected to said structure for deriving an electrical output from said structure.

20. An oscillator circuit comprising:

a body of semiconductor material at least a portion of which is a superlattice structure having at least 10 layers of semiconductor material, the first and alternate layers thereof having a given band-edge energy, the second and alternate layers thereof having a band edge energy different from said given band-edge energy and forming with said first and alternate layers at least five spatial periods, the width of each period being less than the mean free path of a carrier along the direction of the superlattice and having an upper bound of the order of 500 A., and means connected serially with said structure for applying an electric field across said body in excess of a threshold field in response to which said body exhibits a negative resistance, and, a load coupled to said body for producing high frequency oscillations.

21. A bistable circuit comprising:

a body of semiconductor material at least a portion of which is a superlattice structure having at least 10 layers of semiconductor material, the first and alternate layers thereof having a given band-edge energy, the second and alternate layers thereof having a band-edge energy different from said given band-edge energy and forming with said first and alternate layers at least five spatial periods, the width of each period being less than the mean free path of a carrier along the direction of the superlattice, and having an upper bound of the order of 500A., and means connected serially with said superlattice structure for applying an electric field across said body, said body exhibiting a negative resistance when a field above a threshold field is applied, and, a load connected to said body.

22. A semiconductor device which exhibits bulk negative resistance comprising:

a superlattice formed from at least 10 periodically alternating layers of semiconductor material, the first and alternate layers thereof having a given conductivity, the second and alternate layers thereof having a conductivity different from said given conductivity and forming with said first and alternate layers at least five spatial periods, the width of each period being less than the mean free path of carriers along the direction of the superlattice, and having an upper bound of the order of 500 A., and means for applying a voltage to said superlattice said voltage being less than that needed to produce interband tunneling.

* * * * *